(12) United States Patent
Naulleau

(10) Patent No.: US 6,798,494 B2
(45) Date of Patent: Sep. 28, 2004

(54) APPARATUS FOR GENERATING PARTIALLY COHERENT RADIATION

(75) Inventor: Patrick P. Naulleau, Oakland, CA (US)

(73) Assignee: EUV LLC, Santa Clara, CA (US)

( * ) Notice: Subject to any disclaimer, the term of this patent is extended or adjusted under 35 U.S.C. 154(b) by 213 days.

(21) Appl. No.: 09/944,391

(22) Filed: Aug. 30, 2001

(65) Prior Publication Data

US 2003/0043359 A1 Mar. 6, 2003

(51) Int. Cl.[7] .......................... G03B 27/54; G02B 5/00; G21K 5/00
(52) U.S. Cl. .......................... 355/67; 359/664; 359/857; 359/858; 378/34
(58) Field of Search .......................... 355/53, 67, 71, 355/77; 359/664, 856, 857, 858; 378/34

(56) References Cited

U.S. PATENT DOCUMENTS

| 4,974,919 | A | * | 12/1990 | Muraki et al. ............... 359/204 |
| 5,307,207 | A | * | 4/1994 | Ichihara ...................... 359/622 |
| 5,510,230 | A | | 4/1996 | Tennant et al. |
| 5,512,759 | A | | 4/1996 | Sweatt |
| 5,534,970 | A | * | 7/1996 | Nakashima et al. .......... 355/53 |
| 5,920,380 | A | | 7/1999 | Sweatt |
| 6,031,598 | A | * | 2/2000 | Tichenor et al. ............... 355/67 |
| 6,033,079 | A | | 3/2000 | Hudyma |
| 6,072,852 | A | | 6/2000 | Hudyma |
| 6,084,938 | A | | 7/2000 | Hara et al. |
| 6,162,577 | A | * | 12/2000 | Felter et al. ............. 430/270.1 |
| 6,183,095 | B1 | | 2/2001 | Hudyma |
| 6,188,513 | B1 | | 2/2001 | Hudyma |
| 6,198,793 | B1 | | 3/2001 | Schultz et al. |
| 6,226,346 | B1 | | 5/2001 | Hudyma |
| 6,262,836 | B1 | | 7/2001 | Hudyma et al. |
| 6,563,564 | B2 | * | 5/2003 | de Mol et al. ................ 355/52 |

OTHER PUBLICATIONS

Naulleau, P. et al., "Characterization of the accuracy of EUV phase–shifting point diffraction interferometry", *SPIE*, vol. 3331, pp. 114–123.

White, D.L. et al., "Modification of the coherence of undulator radiation", *Rev. Sci. Instrum.*, 66 (2), Feb. 1995, pp. 1930–1933.

* cited by examiner

Primary Examiner—Alan Mathews
(74) Attorney, Agent, or Firm—Fliesler Meyer LLP

(57) ABSTRACT

The effective coherence of an undulator beamline can be tailored to projection lithography requirements by using a simple single moving element and a simple stationary low-cost spherical mirror. The invention is particularly suited for use in an illuminator device for an optical image processing system requiring partially coherent illumination. The illuminator includes: (i) source of coherent or partially coherent radiation which has an intrinsic coherence that is higher than the desired coherence; (ii) a reflective surface that receives incident radiation from said source; (iii) means for moving the reflective surface through a desired range of angles in two dimensions wherein the rate of the motion is fast relative to integration time of said image processing system; and (iv) a condenser optic that re-images the moving reflective surface to the entrance plane of said image processing system, thereby, making the illumination spot in said entrance plane essentially stationary.

33 Claims, 3 Drawing Sheets

Full pupil

APPARATUS FOR GENERATING PARTIALLY COHERENT RADIATION

The U.S. Government has certain rights in this invention pursuant to Contract No. DE-AC03-76SF00098 between the United States Department of Energy and the University of California for the operation of the Lawrence Berkeley National Laboratory.

FIELD OF THE INVENTION

EUV lithography (EUVL) is an emerging technology in the microelectronics industry. It is one of the leading candidates for the fabrication of devices with feature sizes of 70 nm and smaller. Synchrotron radiation facilities provide a convenient source of EUV radiation for the development of this technology.

This invention relates to techniques for generating partially coherent radiation and particularly for converting effectively coherent radiation from a synchrotron to partially coherent extreme ultraviolet radiation suitable for projection photolithography.

BACKGROUND OF THE INVENTION

In general, lithography refers to processes for pattern transfer between various media. A lithographic coating is generally a radiation-sensitized coating suitable for receiving a cast image of the subject pattern. Once the image is cast, it is indelibly formed in the coating. The recorded image may be either a negative or a positive of the subject pattern. Typically, a "transparency" of the subject pattern is made having areas which are selectively transparent or opaque to the impinging radiation. Exposure of the coating through the transparency placed in close longitudinal proximity to the coating causes the exposed area of the coating to become selectively crosslinked and consequently either more or less soluble (depending on the coating) in a particular solvent developer. The more soluble (i.e., uncrosslinked) areas are removed in the developing process to leave the pattern image in the coating as less soluble crosslinked polymer.

Projection lithography is a powerful and essential tool for microelectronics processing and has supplanted proximity printing. "Long" or "soft" x-rays (a.k.a. Extreme UV) (wavelength range of 10 to 20 nm) are now at the forefront of research in efforts to achieve smaller transferred feature sizes. With projection photolithography, a reticle (or mask) is imaged through a reduction-projection (demagnifying) lens onto a wafer. Reticles for EUV projection lithography typically comprise a glass substrate coated with an EUV reflective material and an optical pattern fabricated from an EUV absorbing material covering portions of the reflective surface. In operation, EUV radiation from the illumination system (condenser) is projected toward the surface of the reticle and radiation is reflected from those areas of the reticle rpflective surface which are exposed, i.e., not covered by the EUV absorbing material. The reflected radiation is re-imaged to the wafer using a reflective optical system and the pattern from the reticle is effectively transcribed to the wafer.

A source of EUV radiation is the laser-produced plasma EUV source, which depends upon a high power, pulsed laser (e.g., a yttrium aluminum garnet ("YAG") laser), or an excimer laser, delivering 500 to 1,000 watts of power to a 50 $\mu$m to 250 $\mu$m spot, thereby heating a source material to, for example, 250,000 C, to emit EUV radiation from the resulting plasma. Plasma sources are compact, and may be dedicated to a single production line so that malfunction does not close down the entire plant. A stepper employing a laser-produced plasma source is relatively inexpensive and could be housed in existing facilities. It is expected that EUV sources suitable for photolithography that provide bright, incoherent EUV and that employ physics quite different from that of the laser-produced plasma source will be developed. One such source under development is the EUV discharge source.

EUV lithography machines for producing integrated circuit components are described for example in Tichenor et al. U.S. Pat. No. 6,031,598. Referring to FIG. 5, the EUV lithography machine comprises a main vacuum or projection chamber 2 and a source vacuum chamber 4. Source chamber 4 is connected to main chamber 2 through an airlock valve (not shown) which permits either chamber to be accessed without venting or contaminating the environment of the other chamber. Typically, a laser beam 30 is directed by turning mirror 32 into the source chamber 4. A high density gas, such as xenon, is injected into the plasma generator 36 through gas supply 34 and the interaction of the laser beam 30, and gas supply 34 creates a plasma giving off the illumination used in EUV lithography. The EUV radiation is collected by segmented collector 38, that collects about 30% of the available EUV light, and directed toward the pupil optics 42. The pupil optics consists of long narrow mirrors arranged to focus the rays from the collector at grazing angles onto an imaging mirror 43 that redirects the illumination beam through filter/window 44. Filter 44 passes only the desired EUV wavelengths and excludes scattered laser beam light in chamber 4. The illumination beam is then reflected from the relay optics 46, another grazing angle mirror, and then illuminates the pattern on the reticle 48. Mirrors 38, 42, 43, and 46 together comprise the complete illumination system or condenser. The reflected pattern from the reticle 48 then passes through the projection optics 50 which reduces the image size to that desired for printing on the wafer. After exiting the projection optics 50, the beam passes through vacuum window 52. The beam then prints its pattern on wafer 54.

Although no longer under serious consideration for high-volume commercial fabrication applications, synchrotron sources play an extremely important role in the development of EUV lithography technology. Being readily available, highly reliable, and efficient producers of EUV radiation, synchrotron radiation sources are well suited to the development of EUV lithography. These sources are currently used for a variety of at-wavelength EUV metrologies such as reflectometry, interferometry and scatterometry.

In the case of synchrotron radiation sources, there are three types of sources: bending magnets, wigglers, and undulators. In bending magnet sources, the electrons are deflected by a bending magnet and photon radiation is emitted. Wiggler sources comprise a so-called wiggler for the deflection of the electron or of an electron beam. The wiggler includes a multiple number of alternating poled pairs of magnets arranged in a series. When an electron passes through a wiggler, the electron is subjected to a periodic, vertical magnetic field; the electron oscillates correspondingly in the horizontal plane. Wigglers are further characterized by the fact that no coherency effects occur. The synchrotron radiation produced by a wiggler is similar to that of a bending magnet and radiates in a horizontal steradian. In contrast to the bending magnet, it has a flow that is reinforced by the number of poles of the wiggler.

Finally, in the case of undulator sources, the electrons in the undulator are subjected to a magnetic field with shorter periods and a smaller magnetic field of the deflection pole than in the case of the wiggler, so that interference effects of synchrotron radiation occur. Due to the interference effects, the synchrotron radiation has a discontinuous spectrum and radiates both horizontally and vertically in a small steradian element, i.e., the radiation is strongly directed.

In lithographic applications, the partial coherence of the illumination (sigma) is often defined as the ratio of the illumination angular range to the numerical aperture of the imaging (projection optical) system. The illumination angular range is also referred to as the divergence of the source. Undulator radiation is much like a laser source in that it produces highly-coherent light of very low divergence. A typical EUV undulator beamline produces a sigma of less than 0.1 whereas lithographic application nominally require a sigma of 0.7 or higher. Although less coherent than undulator radiation, bending magnet radiation is also typically too coherent to be directly used for lithography.

As EUV lithography technology matures, more lithographic printing stations will be required for resist and process development. Proliferation of these systems has been slowed by the lack of reliable and cost-effective EUV sources. It would be greatly desirable to alleviate the dearth of EUV sources for lithographic process development applications in the form of small-field static microsteppers through the use synchrotron radiation. The relatively high coherence of these sources, however, has precluded them from being used more extensively for actual lithography studies. Relevant process development applications require much more incoherence than is inherently provided by synchrotron sources. This is especially true of undulator sources that otherwise would be highly desirable for their large EUV power capabilities.

SUMMARY OF THE INVENTION

The present invention allows the effective coherence of a synchrotron beamline to be tailored to photolithography applications by using a simple single moving element and a simple stationary low-cost spherical mirror. The invention is highly efficient and allows for in situ control of the coherence properties of the illumination.

As stated above, a source with lower coherence has larger divergence, however, simply forcing a coherent illumination source to diverge by way of a focusing optic (i.e. lens, mirror, or Freznel Zone plate) or stationary scatter plate would not actually reduce the beam coherence. Reduced coherence requires that the source divergence be comprised of mutually incoherent propagation angles. When a coherent beam is simply forced to diverge using a static optical element, the resulting propagation angles remain coherent as evidenced by the ability to focus to a near-diffraction-limited spot in the case of a focusing optic or the ability to create speckle as in the case of a scatter plate.

To decorrelate the different propagation angles, and hence decoherentize the radiation, a random time-varying phase term could be imparted to the individual propagation angles or the individual propagation angles could be guaranteed never to coexist in time, thereby ensuring their mutual incoherence. The former case can be accomplished, for example, in the case of a scatter plate by continually moving the plate within the beam. The present invention is based, in part, on the recognition that in the latter case, decoherentizing can be achieved by scanning the beam through a set of angles comprising the desired divergence. The illumination created by such a system will appear to have the coherence dictated by the imparted divergence as long as the observation (exposure) time is made long enough such that the entire range of angles is presented during the exposure.

In one embodiment, the invention is directed to an illuminator device for an optical image processing system, wherein the image processing system comprises an optical system requiring partially coherent illumination, and where the illuminator includes:

a source of coherent or partially coherent radiation which has an intrinsic coherence that is higher than the desired coherence;

a reflective surface that receives incident radiation from said source;

means for moving the reflective surface through a desired range of angles in two dimensions wherein the rate of the motion is fast relative to integration time of said image processing system; and a condenser optic that re-images the moving reflective surface to the entrance plane of said image processing system, thereby, making the illumination spot in said entrance plane essentially stationary.

In another embodiment, the invention is directed to a method of modifying the coherence of a beam of radiation from a synchrotron source that includes the steps of:

directing the beam of radiation into a reflective surface;

moving the reflective surface through a desired range of angles in two dimensions wherein the rate of the motion is fast relative to the subsequent observation time; and re-imaging the moving reflective surface to an observation plane, thereby, making the illumination spot in said observation plane essentially stationary.

DETAILED DESCRIPTION OF THE PREFERRED EMBODIMENTS

Figure 1:
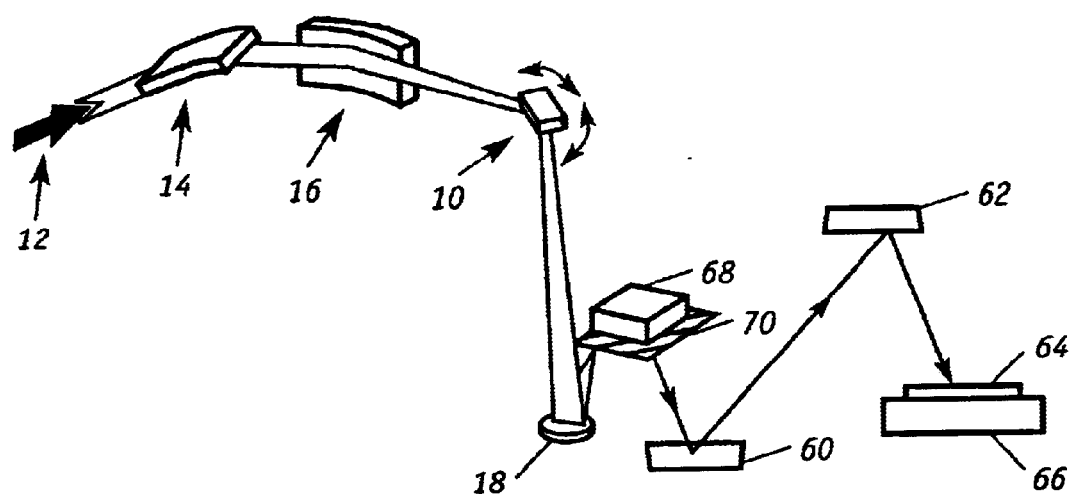
FIGS. 1 and 2 illustrate a configuration of the synchrotron based illuminator.

The lithographic illuminator of the present invention relies on angular scanning to reduce the inherent coherence of synchrotron radiation. FIG. 1 shows a schematic of the preferred embodiment of the scanning illuminator wherein an effectively coherent synchrotron radiation beam 12 is delivered to scanning mirror 10 by way of conventional beamline optics 14,16. The scanning mirror redirects the beam towards relay mirror 18 while scanning through a set of angles falling within the angular acceptance of relay mirror 18. In the case of a "critical" illumination system of FIG. 1, relay mirror 18 is an imaging mirror that re-images the scanning mirror 10 onto reticle 70 which is mounted on reticle stage 68. From the reticle, the reflected pattern is focused by projection optics 60, 62 onto the surface of wafer 64, which is mounted on wafer stage 66. The projection optics can comprise a lithographic optic, which is known in the art. Suitable lithographic optics are described in Hudyma et al. U.S. Pat. Nos. 6,226,346, 6,188,513, 6,072,852 and 6,033,079 which are incorporated herein by reference.

For lithographic applications, the illumination that is produced by the scanning mirror 10 typically has a partial coherence (sigma) that ranges from about 0.3 to 1; for many applications the illumination has a partial coherence of about 0.7.

Assuming the exposure time is greater than or equal to the full scan time of mirror 10, the illumination characteristics will be those defined by the scanning induced divergence. One significant advantage of this illumination system is that it enables the generation of arbitrary divergence patterns by way of controlling the particular scan configuration. This is of great importance for lithographic process development systems as it enables a single illumination system and source to model a wide variety of divergence patterns that might be generated by the variety of commercial sources and illuminators under development. Hence one process development tool would enable a large number commercial-style tools to be simulated in terms of illumination divergence characteristics greatly increasing the utility of the process development tool.

It is important to note that the system described above is a "critical" illumination system, thus any nonuniformities at scanning mirror 10 will be reproduced at reticle 70. This includes both nonuniform illumination and reflectivity of the scanning mirror. Nonuniform scanning-mirror-reflectivity problems can be mitigated by rotating or laterally moving mirror 10 while it scans through the desired range of angles. Nonuniform illumination problems can be mitigated by overfilling the imaging mirror at the cost of optical throughput. Alternatively, the potential non-uniformity problem could be addressed by changing the configuration of the system from "critical" to "Kohler". In the Kohler case, relay mirror 18 serves as a Fourier-transform mirror instead of an imaging mirror. The Kohler configuration requires scanning mirror 10 to be at the front focal plane of relay mirror 18.

Other alternative configurations include using multiple optical elements to provide the imaging or Fourier-transform function of relay mirror 18 and re-imaging the scanning mirror to other planes.

Figure 2:
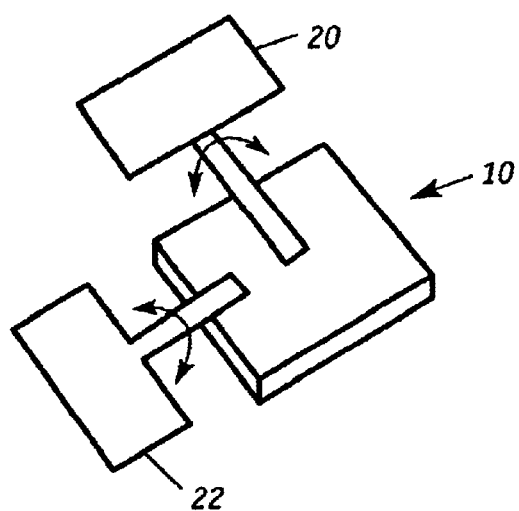

The crucial component of this illumination system is the scanning mirror 10. In the preferred embodiment, as shown in FIG. 2, the movement of scanning mirror 10 is controlled by a tip/tilt mechanisms 20,22 such that the scanning mirror 10 is able to quickly travel through a desired range of angles in two dimensions. This tip/tilt mechanism could be a commercially available piezo stage such as the two-axis mirror tilter made by Piezo Systems, Inc. of Cambridge, Mass.

Figure 3:
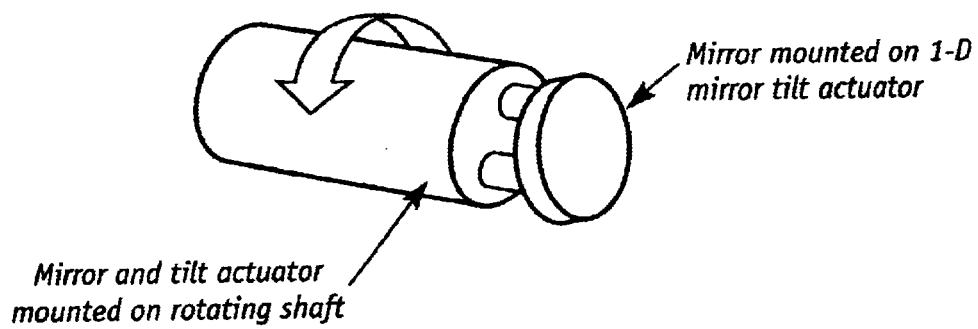
FIG. 3 illustrates a mirror scanning mechanism with a 1-dimensional tilt mechanism.

An alternative to the 2-dimensional tilt mechanism is a 1-dimensional tilt mechanism mounted onto a rotating shaft as shown in FIG. 3. By controlling the tilt and the rotation orientation the beam can be deflected to an arbitrary 2-D angle. In practice the device is preferably rotated at a constant rate and the 1-D tilt angle can be controlled by an arbitrary signal. This type of 2-D mechanism is less suitable for the generation of sparse angle scan patterns. To address this potential shortcoming, this rotating scanner could be coupled with a timed shutter mechanism, at the cost of optical throughput. A potential benefit of the rotating scanner is that it is less susceptible to reflectivity variations on the mirror which otherwise cause illumination uniformity problems in the "critical" configuration.

The scanning mirror 10 can be fabricated of any suitable surface that is reflective to EUV radiation or may be made reflective to EUV radiation by deposition of a reflective multilayer. Preferably, the imaging mirror is a flat mirror, which is a mirror whose surface is nearly flat within manufacturing tolerances. In the preferred embodiment the relay mirror 18 function is preferably provided by a single conventional concave spherical, whose surface forms part of a sphere. Although the present invention employs the use of spherical mirrors for convenience and economical concerns, it is intended that other mirrors be covered by the present invention, such as toroidal, and conic section, e.g., parabolic, hyperbolic, general aspheric, elliptical, cylindrical, etc., mirrors that may be substituted for spherical mirrors within tolerable industry standards, including those with minor flaws or aberrations. Also as described above, the function of the single element relay mirror 18 could also be provided by a more complex multi-element optical system.

A preferred source of the coherent or partially coherent radiation is a synchrotron radiation source, which is a broadband source capable of operating from the X-ray through infrared regimes. The synchrotron is constructed from a storage ring providing for relativistic electrons or positrons confined by magnetic fields to a repeating orbital path. A suitable source is the synchrotron undulator beamline source (CXRO beamline 12.0.1.2 at the Advanced Light Source, Lawrence Berkeley National Laboratory) operating at a wavelength of 13.4 nm with a bandwidth $\lambda/\Delta\lambda$ of about 200.

The performance of the illuminator of the present invention can be verified by way of monitoring the lithographic optic's "pupil fill". As described above, illumination partial coherence (or sigma) can be viewed as the ratio of the lithographic optic's (or any other imaging optic) numerical aperture (NA) to the illumination NA (or divergence). This ratio can be conveniently visualized by observing the pupil fill of the lithographic optic when illuminating a clear object field of limited extent. In this way, the illumination angular content (divergence) can be directly viewed relative to the lithographic optic's NA.

Figure 4A:
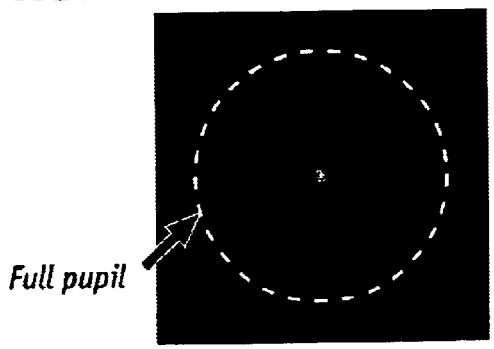
FIGS. 4a, 4b, 4c, and 4d are various pupil-fill images.

For example, when the illumination is effectively coherent (divergence is very small) the pupil-fill image will contain one small spot having a width that is significantly smaller (typically more than 10 times smaller) than the full width defined by the lithographic optic's NA. FIG. 4a shows such a pupil-fill image for a 0.1 NA EUV lithographic optic with direct undulator illumination (the scanner of the present invention turned off). This image was recorded using an EUV sensitive CCD camera positioned downstream of the lithographic optic's image plane so as to record an image of the lithographic optic's pupil.

Figure 4B:
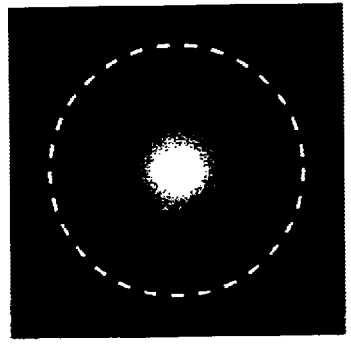

On the other hand, for the case of conventional partially coherent illumination (relatively large divergence) the pupil-fill image will contain a disk of illumination that occupies a significant portion of the lithographic optic's NA. For typical applications the illumination width will range from 30% to 100% of the full pupil, yielding sigma values of 0.3 to 1, respectively. FIG. 4b shows a pupil-fill image for a 0.1 NA EUV lithographic optic with undulator radiation having a coherence modified by the present invention. The range of scanning angles is chosen to fill an angular disk occupying approximately 50% of the pupil (sigma=0.5). The exposure time of the EUV CCD is chosen to be significantly longer than the time it takes for the scanner to scan through the full desired angle range.

Figure 4C:
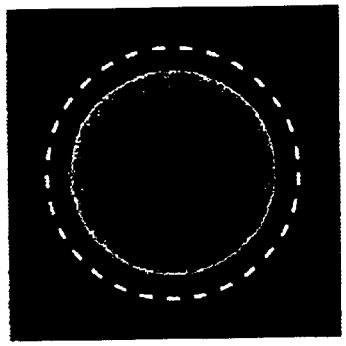
Figure 4D:
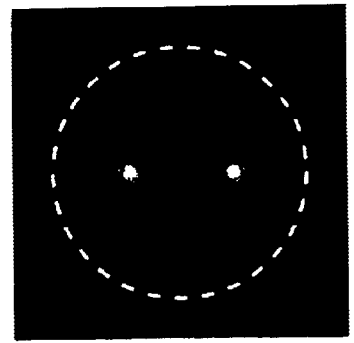
Figure 5:
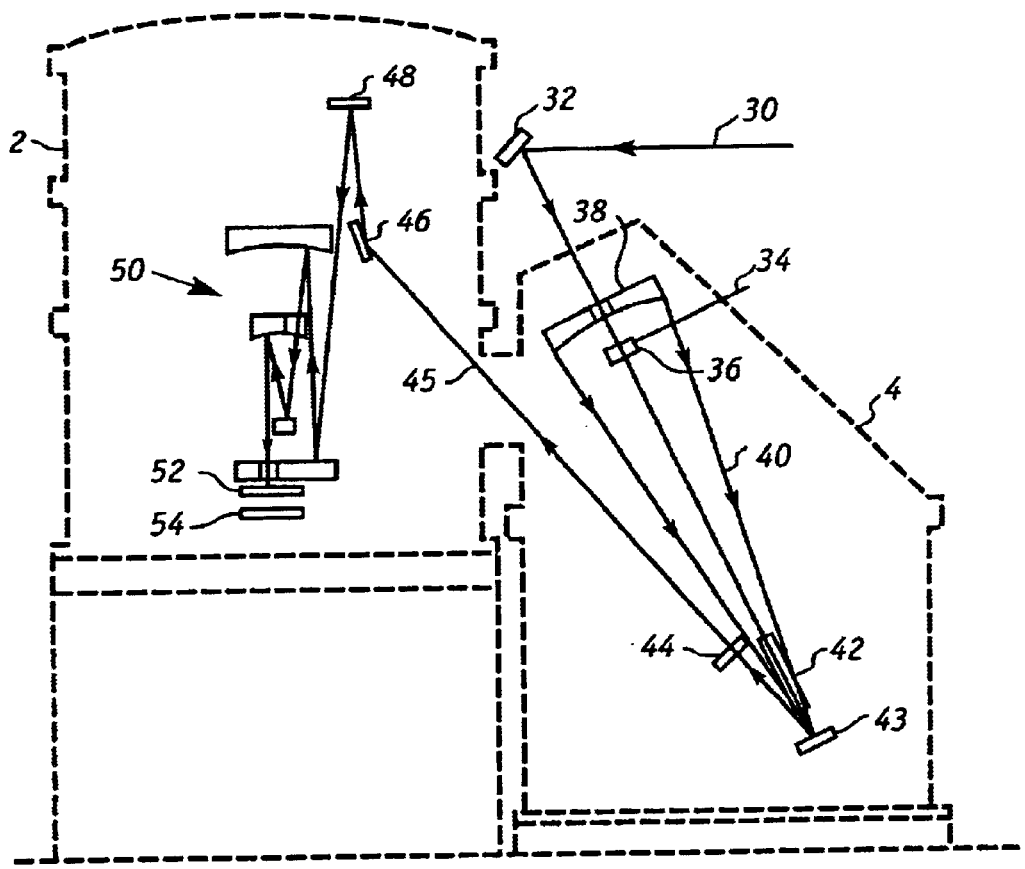
FIG. 5 illustrates a prior art EUV lithography machine.

In addition to enabling the conventional fill patterns described above, the present invention also enables more complicated fill patterns as shown in FIGS. 4c and 4d. The pupil-fill images of annular and dipole illuminations were recorded on the system and in the manner described above.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. An illuminator device for an optical image processing system, wherein the image processing system comprises an optical system requiring partially coherent illumination, and where the illuminator comprises:

a source of coherent or partially coherent radiation which has an intrinsic coherence that is higher than the desired coherence;

a reflective surface that receives incident radiation from said source;

means for moving the reflective surface through a desired range of angles in two dimensions to scan the beam through a set of angles comprising a desired divergence, wherein the rate of the motion is fast relative to integration time of said image processing system; and a condenser optic that re-images the moving reflective surface to the entrance plane of said image processing system, thereby, making the an illumination spot created in said entrance plane essentially stationary.

2. The illuminator of claim 1 wherein the means for moving the reflective surface moves through the entire desired range of angles at lease once during the integration time of the image processing system.

3. The illuminator of claim 1 wherein the source of partially coherent radiation comprise a synchrotron source.

4. The illuminator of claim 1 wherein the source of partially coherent radiation comprises an undulator source.

5. The illuminator of claim 1 wherein the reflective surface comprises a flat mirror.

6. The illuminator of claim 3 wherein the reflective surface comprises a multilayer-coated flat mirror.

7. The illuminator of claim 4 wherein the reflective surface comprises a multilayer-coated flat mirror.

8. The illuminator of claim 1 wherein the condenser optic is a single reflective element.

9. The illuminator of claim 8 wherein the reflective condenser element is spherical.

10. The illuminator of claim 3 wherein the condenser optic is single reflective multilayer-coated element.

11. The illuminator of claim 10 wherein the reflective multilayer-condenser element is spherical.

12. The illuminator of claim 4 wherein the condenser optic is a single reflective multilayer-coated element.

13. The illuminator of claim 12 wherein the reflective multiplayer-condenser element is spherical.

14. The illuminator of claim 1, wherein the means for moving the reflective surface through a range of angles in two dimensions is a one-dimensional tilt mechanism mounted on a rotatable shaft.

15. The illuminator of claim 1, wherein the means for moving the reflective surface through a range of angles in two dimensions is controlled by a tip and tilt mechanism.

16. A method of modifying the coherence of a beam of coherent or partially coherent radiation comprising the steps of:

(a) directing the beam of radiation into a reflective surface;

(b) moving the reflective surface through a range of angles in two dimensions to scan the beam through a set of angles comprising a desired divergence, wherein the rate of the motion is fast relative to the subsequent observation time; and (c) re-imaging the image from the moving reflective surface to an observation plane, thereby making an illumination spot created in said observation plane essentially stationary.

17. The method of claim 16 wherein step b comprises moving the reflective surface through the entire range of angles at least once during the integration time of the image processing system.

18. The method of claim 16 wherein the source of partially coherent radiation comprises a synchrotron source.

19. The method of claim 16 wherein the source of partially coherent radiation comprises an undulator source.

20. The method of claim 16 wherein the reflective surface comprises a flat mirror.

21. The method of claim 18 wherein the reflective surface comprises a multiplayer-coated flat mirror.

22. The method of claim 19 wherein the reflective surface comprises a multiplayer-coated flat mirror.

23. The method of claim 16 wherein step c employs a condenser optic that has a single reflective element.

24. The method of claim 23 wherein the reflective condenser element is spherical.

25. The method of claim 23 wherein the condenser optic is a single reflective multiplayer-coated element.

26. The method of claim 25 wherein the reflective multiplayer-condenser element is spherical.

27. The method of claim 19 wherein the condenser optic is a single reflective multiplayer-coated element.

28. The method of claim 27 wherein the reflective multiplayer-condenser element is spherical.

29. The method of claim 16 wherein step b comprises moving the reflective surface comprises tilting the optic in two dimensions.

30. A lithographic illuminator wherein:

an effectively coherent synchrotron radiation beam is delivered to a scanning mirror by beamline optics, the scanning mirror redirects the beam towards a relay mirror while said scanning mirror scans through a set of angles falling within an angular acceptance of said relay mirror, said relay mirror reflects a pattern from said scanning mirror onto a reticle, and the reflected pattern from the reticle is focused by projection optics onto a surface of a wafer.

31. The lithographic illuminator of claim 30 wherein the projection optics comprises a lithographic optic.

32. The lithographic illuminator of claim 30, wherein an illumination that is produced by the scanning mirror has a partial coherence that ranges from about 0.3 to 1 sigma.

33. The lithographic illuminator of claim 30, wherein said relay mirror is an imaging mirror.

* * * * *